(12) United States Patent
Kubota

(10) Patent No.: US 8,346,033 B2
(45) Date of Patent: Jan. 1, 2013

(54) OPTICAL COUPLER AND PRODUCING METHOD THEREOF

(75) Inventor: Tetsuro Kubota, Kyoto (JP)

(73) Assignee: OMRON Corporation, Kyoto (JP)

( * ) Notice: Subject to any disclaimer, the term of this patent is extended or adjusted under 35 U.S.C. 154(b) by 176 days.

(21) Appl. No.: 13/016,641

(22) Filed: Jan. 28, 2011

(65) Prior Publication Data

US 2011/0211790 A1     Sep. 1, 2011

(30) Foreign Application Priority Data

Mar. 1, 2010  (JP) .................................. 2010-043898

(51) Int. Cl.
*G02B 6/12* (2006.01)
*G02B 6/26* (2006.01)
*G02B 6/42* (2006.01)
*G02B 6/36* (2006.01)

(52) U.S. Cl. ................. 385/14; 385/39; 385/93
(58) Field of Classification Search .................. None
See application file for complete search history.

(56) References Cited

U.S. PATENT DOCUMENTS

| 5,150,438 | A  | * | 9/1992 | Brown .......................... 385/14 |
| 6,031,251 | A  | * | 2/2000 | Gempe et al. .................. 257/84 |
| 6,246,123 | B1 |   | 6/2001 | Landers, Jr. et al. |
| 7,021,839 | B2 | * | 4/2006 | Ho ................................. 385/92 |
| 7,748,912 | B2 | * | 7/2010 | Ho et al. ......................... 385/92 |
| 2004/0081409 | A1 |   | 4/2004 | Ho |
| 2005/0286840 | A1 | * | 12/2005 | Ho et al. ......................... 385/92 |
| 2008/0187013 | A1 |   | 8/2008 | Guenter et al. |
| 2011/0211790 | A1 | * | 9/2011 | Kubota ........................... 385/39 |

FOREIGN PATENT DOCUMENTS

| JP | 05-218491 A | | 8/1993 |
| JP | 2011181647 A | * | 9/2011 |

OTHER PUBLICATIONS

Extended European Search Report for European Application No. 10196583.8, Dated Dec. 6, 2011 (6 pages).

* cited by examiner

*Primary Examiner* — Rhonda Peace
(74) *Attorney, Agent, or Firm* — Osha Liang LLP

(57) ABSTRACT

A method for producing the optical coupler includes mounting a first conversion element on an upper surface of a first terminal plate, mounting a second conversion element on an upper surface of a second terminal plate, supplying a translucent primary mold resin in a fluidized state to the upper surfaces of the first terminal plate and the second terminal plate such that the first conversion element and the second conversion element are covered with the primary mold resin, curing the primary mold resin while inverting vertically the first terminal plate and the second terminal plate to retain the primary mold resin in a state in which the primary mold resin hangs from the first terminal plate and the second terminal plate, and covering a surface of the primary mold resin with a secondary mold resin having a refractive index lower than that of the primary mold resin.

6 Claims, 23 Drawing Sheets

OPTICAL COUPLER AND PRODUCING METHOD THEREOF

BACKGROUND OF THE INVENTION

1. Technical Field

The present invention relates to an optical coupler that electrically couples one terminal and the other terminal through an optical signal and a producing method thereof. Specifically, the invention relates to an optical coupler that converts an input electric signal into the optical signal, and converts the optical signal into an output electric signal, thereby electrically coupling the input electric signal and the output electric signal while insulation between the input electric signal and the output electric signal is maintained, and a producing method thereof.

2. Related Art

The optical coupler includes a light emitting element that converts the input electric signal into the optical signal and a light receiving element that converts the optical signal into the output electric signal, and the optical coupler has a structure in which the light emitted from the light emitting element is received by the light receiving element after reflected by a reflecting surface. In the optical coupler, desirably the light emitting element and the light receiving element are brought close to each other in order to enhance coupling efficiency between the light emitting element and the light receiving element to increase a light receiving amount in the light receiving element. However, unfortunately a dielectric withstanding voltage is degraded when the light emitting element and the light receiving element are brought close to each other.

For example, Japanese Patent Publication Laid-Open No. 5-218491 discloses an optical coupler. In an optical coupler 11 disclosed in Japanese Patent Publication Laid-Open No. 5-218491, a light emitting element 15 and a light receiving element 16 are mounted on wiring patterns 13 and 14 formed on an upper surface of the heat-resistant substrate 12, respectively. A primary mold body 17 (translucent resin) with which the light emitting element 15 and the light receiving element 16 are covered is formed into an elliptical shape when viewed from a side face, an emission surface of the light emitting element 15 is disposed at a first focal point of the ellipse, and a light receiving surface of the light receiving element 16 is disposed at a second focal point. The reflecting surface is formed in an outer peripheral surface of the primary mold body 17 by depositing a high-reflectance metallic reflecting film 18 using Al, Au, or Cu. Surroundings of the metallic reflecting film 18 and primary mold body 17 are covered with a secondary mold body 19 in order to block ambient light.

According to the optical coupler 11 having the structure of FIG. 1, the light emitted from the emission surface (a first focal point) of the light emitting element 15 is collected in the light receiving surface (a second focal point) of the light receiving element 16 after reflected by the metallic reflecting film 18, so that the use efficiency of the light can be improved while a distance between the light emitting element 15 and the light receiving element 16 is maintained.

However, in the optical coupler 11, because the metallic reflecting film 18 is used as the reflecting surface, an insulating property between the light emitting element 15 and the metallic reflecting film 18 or an insulating property between the light receiving element 16 and the metallic reflecting film 18 is easy to degrade. Because the metallic reflecting film 18 is deposited by sputtering, man-hour and material cost are increased, which easily increases cost of the optical coupler. Because an inorganic material layer (a metallic reflecting film) is formed at an interface between the primary mold body and the secondary mold body, unfortunately the interface is easily peeled off to degrade reliability of the optical coupler.

SUMMARY

One or more embodiments of the invention provides an optical coupler that can further improve both the insulating property and the optical coupling efficiency between the light emitting element and the light receiving element in the optical coupler having the structure in which the light emitted from the light emitting element is received by the light receiving element after reflected by the reflecting surface.

In accordance with one or more embodiments of the invention, an optical coupler in which a first conversion element that converts an electric signal into an optical signal and a second conversion element that converts the optical signal into the electric signal are mounted on surfaces of a first terminal plate and a second terminal plate, the surfaces being oriented toward an identical direction, the first conversion element and the second conversion element are covered with a translucent primary mold resin, a surface of the primary mold resin is covered with a secondary mold resin having a refractive index lower than that of the primary mold resin, and the first conversion element and the second conversion element are optically coupled by totally reflecting the optical signal emitted from the first conversion element at an interface between the primary mold resin and the secondary mold resin, wherein the surface of the primary mold resin is formed into an elliptical surface, an emission center of the first conversion element is located on a side farther away from a center of the elliptical surface than a plane perpendicular to a plane that passes through one of focal points on an axis on which the elliptical surface exists, is perpendicular to a surface in which the first conversion element is mounted on the first terminal plate and a plane including the axis, and the surface in which the first conversion element is mounted on the first terminal plate, and a center of a light receiving region of the second conversion element is located on a side farther away from the center of the elliptical surface than a plane perpendicular to a plane that passes through the other focal points on the axis, is perpendicular to a surface in which the first conversion element is mounted on the first terminal plate and the plane including the axis, and the surface in which the first conversion element is mounted on the first terminal plate.

In the optical coupler of one or more embodiments of the invention, the optical signal is totally reflected at the interface between the primary mold resin and the secondary mold resin with no use of the metallic reflecting film, whereby the optical signal emitted from the first conversion element is guided to and received by the second conversion element. Accordingly, unlike the related art, there is no risk of degrading the insulating properties of the first conversion element and second conversion element due to the metallic reflecting film. It is not necessary to form the metallic reflecting film on the surface of the primary mold resin by plating, so that the optical coupler producing process can be simplified to suppress the production cost of the optical coupler. There is a risk of generating the peel-ff of the interface between the primary mold resin and the secondary mold resin when the metallic reflecting film is provided between the mold resins. On the other hand, in the optical coupler of one or more embodiments of the invention, the peel-ff of the interface is not generated because the metallic reflecting film is not used.

Additionally, although the metallic reflecting film is not used, the surface of the primary mold resin is formed into an elliptical surface, an emission center of the first conversion element is located on a side farther away from a center of the elliptical surface than a plane perpendicular to a plane that passes through one of focal points on an axis on which the elliptical surface exists, is perpendicular to a surface in which the first conversion element is mounted on the first terminal plate and a plane including the axis, and the surface in which the first conversion element is mounted on the first terminal plate. Therefore, the optical signal emitted from the first conversion element is not totally reflected at the interface between the primary mold resin and the secondary mold resin, and the optical signal is hardly transmitted through the interface to leak to the outside. Therefore, the optical signal emitted from the first conversion element can efficiently enter the second conversion element, and the optical coupling efficiency between the first conversion element and the second conversion element can be improved.

In the optical coupler in accordance with one or more embodiments of the invention, the first conversion element and the second conversion element are mounted on surfaces of the first conversion element and the second conversion element, respectively, the surfaces of the first conversion element and the second conversion element being located opposite a surface parallel to the surface on which the first conversion element of the first terminal plate is mounted. Accordingly, when the optical signal is emitted from the first conversion element, the optical signal that leaks to the outside from the interface (hereinafter referred to as a reflecting surface) between the primary mold resin and the secondary mold resin can be reduced to improve the optical coupling efficiency between the first conversion element and the second conversion element.

In the optical coupler in accordance with one or more embodiments of the invention, the axis is a long axis of the elliptical surface. Accordingly, because a curvature of a path of the optical signal emitted from the first conversion element to the second conversion element can be decreased, the optical signal that leaks to the outside from the reflecting surface can be reduced to improve the optical coupling efficiency between the first conversion element and the second conversion element. Moreover, since the distance between the first conversion element and the second conversion element is lengthened, the insulating property therebetween can be improved.

In the optical coupler in accordance with one or more embodiments of the invention, the axis is inclined with respect to the surface of the first terminal plate on which the first conversion element is mounted. Accordingly, the degree of freedom of the design is enhanced in the optical coupler because the behavior of the light can be changed in the reflecting surface by the inclination angle of the axis of the elliptical surface.

In accordance with one or more embodiments of the invention, a method for producing the optical coupler in accordance with one or more embodiments of the invention includes the steps of: mounting a first conversion element and a second conversion element on upper surfaces of a first terminal plate and a second terminal plate; supplying a translucent primary mold resin in a fluidized state to the upper surfaces of the first terminal plate and the second terminal plate such that the first conversion element and the second conversion element are covered with the primary mold resin; curing the primary mold resin while inverting vertically the first terminal plate and the second terminal plate to retain the primary mold resin in a state in which the primary mold resin hangs from the first terminal plate and the second terminal plate; and covering a surface of the primary mold resin with a secondary mold resin having a refractive index lower than that of the primary mold resin.

According to the optical coupler producing method of one or more embodiments of the invention, the primary mold resin in the fluidized state is retained while hanging from the first terminal plate and the second terminal plate, which allows the primary mold resin to be formed into the substantially elliptical shape. Accordingly, it is not necessary to provide the molding die in order to mold the primary mold resin, and the primary mold resin can efficiently be molded, so that the production cost of the optical coupler can be reduced.

In the optical coupler producing method in accordance with one or more embodiments of the invention, a portion of the first terminal on which the first conversion element is mounted and a portion of the second terminal on which the second conversion element is mounted are formed into an elliptical shape as a whole. Therefore, when the primary mold resin in the fluidized state is supplied onto the first terminal plate and second terminal plate, the edge of the primary mold resin is controlled by the first terminal plate and second terminal plate so as to become the elliptical shape. As a result, the primary mold resin can be shaped into the substantially elliptical surface when hanging from the first terminal plate and the second terminal plate.

DETAILED DESCRIPTION

Embodiments of the invention will be described below with reference to the accompanying drawings. However, the invention is not limited to the embodiments, but various design changes can be made without departing from the scope of the invention. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

First Embodiment

Figure 1:
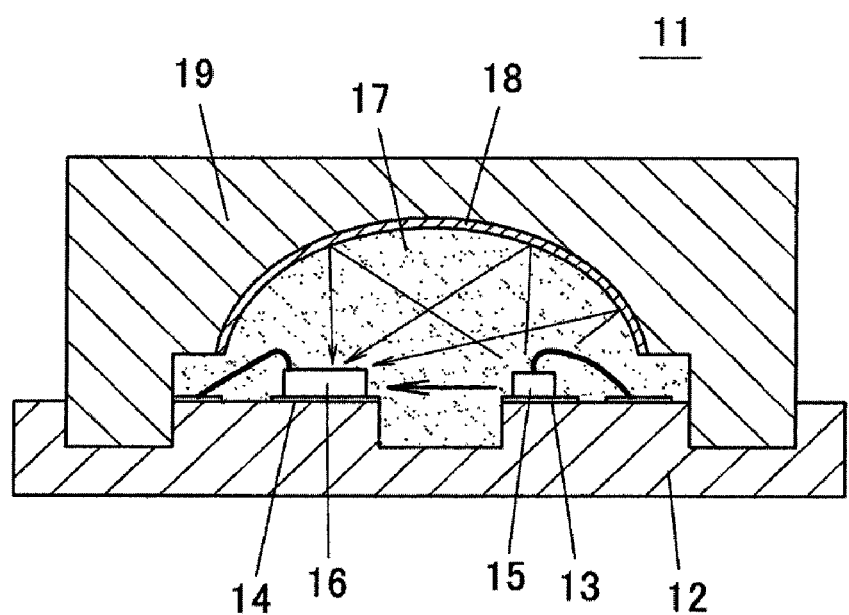
FIG. 1 is a sectional view of an optical coupler disclosed in Japanese Patent Publication Laid-Open No. 5-218491.
Figure 2:
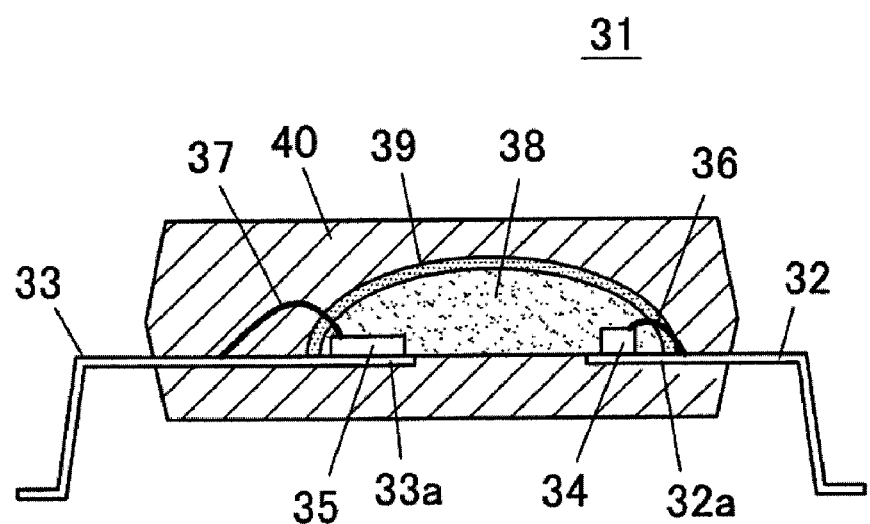
FIG. 2 is a sectional view of an optical coupler according to a first embodiment of the invention.
Figure 3:
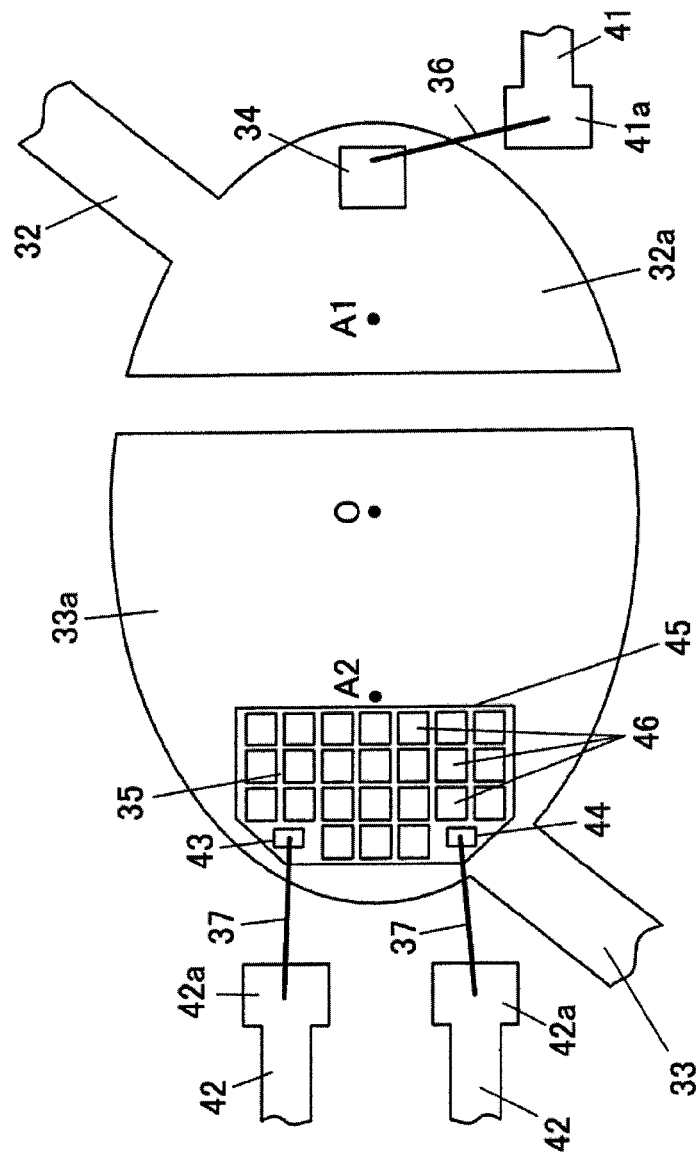
FIG. 3 is a plan view illustrating a state in which a light emitting element and a light receiving element are mounted on an element mounting portion of a lead frame in the optical coupler of the first embodiment.

A structure of an optical coupler 31 according to a first embodiment of the invention will be described. FIG. 2 is a sectional view illustrating the structure of the optical coupler 31 of the first embodiment. FIG. 3 is a plan view illustrating a light emitting element 34 (a first conversion element) and a light receiving element 35 (a second conversion element), which are mounted on element mounting portions 32a and 33a of lead frames 32 and 33 in the optical coupler 31.

As illustrated in FIG. 3, the optical coupler 31 includes the lead frame 32 (a terminal plate) that is used in die bonding of the light emitting element 34, the lead frame 33 (terminal plate) that is used in die bonding of the light receiving element 35, a lead frame 41 that is used in wire bonding of the light emitting element 34, and lead frames 42 and 42 that are used in wire bonding of the light receiving element 35.

The lead frames 32, 33, 41, and 42 are made of a metallic material such as copper, iron, and 42 alloy. A plating treatment is performed to surfaces of the lead frames 32, 33, 41, and 42. In each of the lead frames 32, 33, 41, and 42, three-layer plating of silver or nickel (lower layer)/palladium (intermediate layer)/gold (upper layer) is performed to a portion (inner lead) sealed by a sealing resin 40 in order to improve a wire bonding property. Two-layer plating of solder plating or silver (under layer)/lead-free plating such as palladium (upper layer) is performed to a portion (outer lead) on the outside of the sealing resin 40 in order to perform the mounting by solder.

The light emitting element 34 is mounted on the element mounting portion 32a, formed at one end of the lead frame 32, by die bonding. In the light emitting element 34, an opposite surface (upper surface) to a die bonding surface constitutes a light outgoing surface. The light emitting element 34 and a wire connection portion 41a of the lead frame 41 are electrically connected by a bonding wire 36 made of a Au line, an Al line, or a Cu line (generally the Au line is used).

The light emitting element 34 converts the electric signal into the optical signal, and a light emitting diode (LED) is mainly used as the light emitting element 34. For example, an AlGaAs system LED, a GaAs/GaAs system LED, and a GaAlAs/GaAlAs/GaAs system LED can be used as the light emitting element 34. Because a peak of an emission wavelength depends on a material, a suitable LED is selected in consideration of a peak sensitivity wavelength of the light receiving element 35 or component cost.

The light receiving element 35 is mounted on the element mounting portion 33a formed at one end of the lead frame 33. The light receiving element 35 mainly includes a photodiode array that converts the optical signal into the electric signal, and a light receiving region is formed in an opposite surface (upper surface) to the mounting surface of the light receiving element 35. Wire bond pads 43 and 44 of the light receiving element 35 and wire connection portions 42a and 42a of the lead frames 42 and 42 are electrically connected by bonding wires 37 made of the Au line, Al line, or Cu line (generally the Au line is used).

In the light receiving element 35, plural light receiving cells 46 are provided in the upper surface of a substrate 45. The light receiving cell 46 is a region where the optical signal is converted into the electric signal, that is, a region where the optical signal is received to generate an optical electromotive force. The light receiving cell 46 mainly includes a photodiode. In such cases, the light receiving element 35 includes the photodiode array. The light receiving cells 46 each of which has an even area are arrayed into a lattice shape at constant intervals, and the light receiving cells 46 are connected in series.

Each of the element mounting portions 32a and 33a of the lead frames 32 and 33 is formed into a planar shape, and the element mounting portions 32a and 33a are disposed in a substantially identical plane so as to be separated from each other. As illustrated in FIG. 3, the element mounting portions 32a and 33a have an elliptical outline as a whole. In other words, a planar-shaped elliptical portion of the lead frame is divided by a slit, and one of divided portions constitutes the element mounting portion 32a while the other divided portion constitutes the element mounting portion 33a. Each of the lead frames 32, 33, 41, and 42 is bent into a shape suitable to the mounting on a printed board on the outside of a sealing resin 40.

As illustrated in FIG. 2, the light emitting element 34 mounted on the element mounting portion 32a and the light receiving element 35 mounted on the element mounting portion 33a are covered with a primary mold portion 38 (primary mold resin) made of a translucent resin. A surface of the primary mold portion 38 is covered with a secondary mold portion 39 (secondary mold resin) that is made of a translucent resin having a refractive index lower than that of the primary mold portion 38. In FIG. 2, the primary mold portion 38 is formed only above the element mounting portions 32a and 33a. However, the primary mold portion 38 may also be formed on lower surface sides of the element mounting portions 32a and 33a (for example, see FIG. 21). In FIG. 2, the secondary mold portion 39 is formed only above the element mounting portions 32a and 33a in the surface of the primary mold portion 38. However, the lower surface of the primary mold portion 38 may also be covered with the secondary mold portion 39.

The primary mold portion 38 and the secondary mold portion 39 are made of a silicone resin, an acrylic resin, or a urethane resin, which has transparency or light permeability. Assuming that ni is a refractive index of the primary mold portion 38 and no is a refractive index of the secondary mold portion 39, usually the refractive indexes fall within a range of $1.7 > n_i \geq n_o > 1.2$.

The substantially whole optical coupler 31 except end portions of the lead frames 32, 33, 41, and 42 is sealed by the opaque sealing resin 40. The sealing resin 40 may be either a light-absorbing resin such as a black resin or a light reflecting resin such as a white resin. An effect (physical protection and chemical protection) that protects the light emitting element 34 and the light receiving element 35 from an external force or a surrounding environment is enhanced when the sealing resin 40 is formed by a silica-filling epoxy resin. Sometimes an IC such as a driver circuit is mounted in the optical coupler 31.

Figure 4:
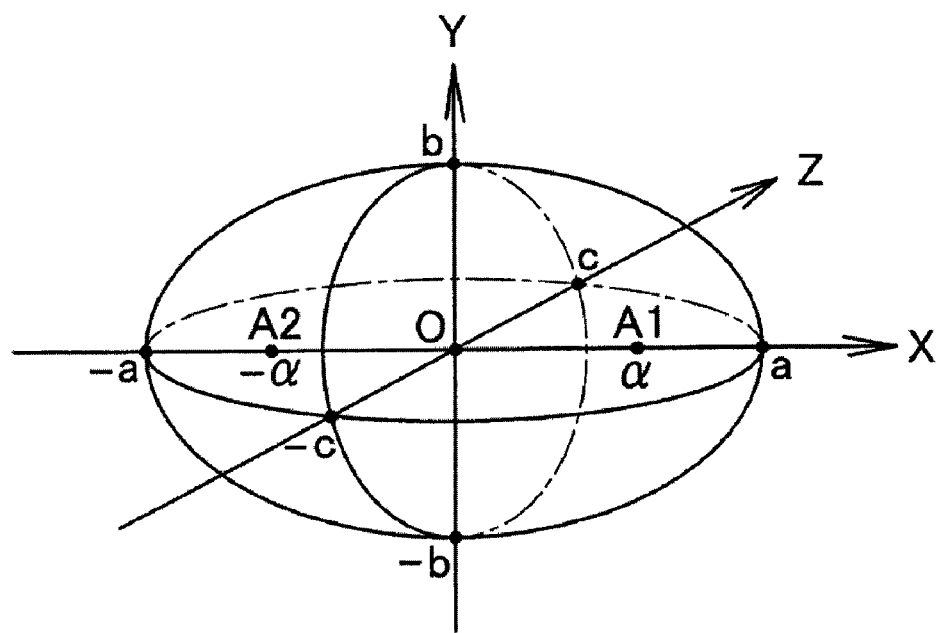
FIG. 4 is a perspective view illustrating a three-dimensional spheroid.

The primary mold portion 38 is formed such that the surface of the primary mold portion 38 becomes the substantially elliptical surface. That is, in the primary mold portion 38, at least a region above the element mounting portions 32a and 33a is formed so as to be substantially matched with a spheroid $(X/a)^2+(Y/b)^2+(Z/C)^2=1$ illustrated in FIG. 4. Where a is a radius in an X-axis direction of the spheroid, b is a radius in a Y-axis direction, and c is a radius in a Y-axis direction. It is assumed that the X-axis direction is set to a long-axis direction of the spheroid (that is, a>b and a>c).

In the optical coupler 31 illustrated in FIG. 2, the Y-axis of the spheroid approximating the primary mold portion 38 is oriented toward a direction (that is, a height direction of the primary mold portion 38) perpendicular to the element mounting portion 32a, the X-axis is oriented in parallel with the element mounting portion 32a toward a horizontal direction connecting the light emitting element 34 and the light receiving element 35, and the Z-axis is oriented toward a width direction of the primary mold portion 38. When the optical coupler 31 is viewed from above (Y-axis direction), the center of the primary mold portion 38 is matched with the center of the spheroid. The region above the element mounting portions 32a and 33a of the primary mold portion 38 is substantially matched with a region of Y>0 of the spheroid. When the direction connecting the light emitting element 34 and the light receiving element 35 is oriented toward the long-axis direction of the spheroid, a distance between the light emitting element 34 and the light receiving element 35 can be lengthened to improve the insulating property between the light emitting element 34 and the light receiving element 35, and a curvature of a reflecting surface (surface of the primary mold portion 38) of the light from the light receiving element 34 toward the light receiving element 35 can be decreased.

An emission center of the light emitting element 34 is substantially located on the X-axis, and the emission center is located on the side farther away from a center O of the spheroid than one of focal points A1 on the X-axis. A center of the light receiving region of the light receiving element 35 is substantially located on the X-axis of the spheroid, and is located on the side farther away from the center O than the other focal point A2 on the X-axis. That is, assuming that A1 $(\alpha,0,0)$ and A2$(-\alpha,0,0)$ are the focal points on the X-axis of the spheroid, $\alpha=\sqrt{(a^2-b^2)}$ holds. Assuming that Xe (>0) is an X-coordinate of the emission center of the light emitting element 34 and Xr (<0) is an X-coordinate of the center of the light receiving region of the light receiving element 35, $-a<Xr<-\alpha$ and $\alpha<Xe<a$ hold.

Figure 5:
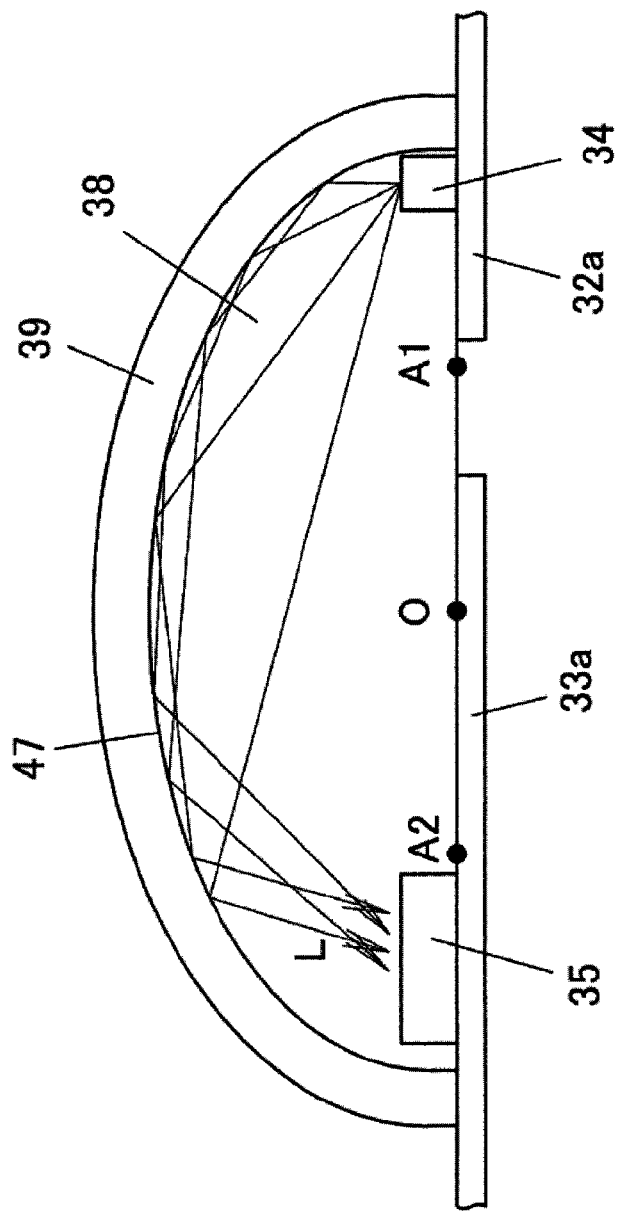
FIG. 5 is a view illustrating a behavior of an optical signal emitted from the light emitting element in the optical coupler of the first embodiment.

According to the optical coupler 31 having the above-described structure, the electric signal input from the lead frame 32 is converted into the optical signal by the light emitting element 34, and the optical signal can be emitted from the light emitting element 34. As illustrated in FIG. 5, an optical signal L emitted from the light emitting element 34 enters the light receiving element 35 after totally reflected once or plural times at the interface between the primary mold portion 38 and the secondary mold portion 39, and the optical signal L is received by each light receiving cell 46. The optical signal L received by the light receiving element 35 is converted into the electric signal by the light receiving element 35, and the converted electric signal is output from the lead frame 33.

Because the plural light receiving cells 46 are connected in series in the light receiving element 35, each light receiving cell 46 receives the optical signal to generate the optical electromotive force, and the large optical electromotive force can be obtained in the whole light receiving element 35. For example, when the electromotive force of 0.5 V to 0.6 V is generated in one light receiving cell 46, the electromotive force of (0.5 V to 0.6 V)×the number of cell steps can be obtained in the whole light receiving element 35.

In the optical coupler 31, the light (optical signal) is guided to the light emitting element 35 after totally reflected at the interface between the primary mold portion 38 and the secondary mold portion 39, which are different from each other in the refractive index, and the metallic reflecting film is not used on the surface of the primary mold portion 38 unlike Japanese Patent Publication Laid-Open No. 5-218491. Therefore, the insulating properties of the light emitting element 34 and light receiving element 35 are not degraded. It is not necessary to provide the metallic reflecting film on the surface of the primary mold portion 38, which allows the cost reduction of the optical coupler 31. Because an inorganic material (metallic reflecting film) is not interposed between the primary mold portion 38 and the secondary mold portion 39, a risk of peeling off the primary mold portion 38 and the secondary mold portion 39 at the interface is eliminated to improve the reliability of the optical coupler 31.

Additionally, in the optical coupler 31, the light emitting element 34 and the light receiving element 35 are located farther than the focal points although the light is guided after totally reflected at the interface (hereinafter referred to as a reflecting surface 47) between the primary mold portion 38 and the secondary mold portion 39 with no use of the metallic reflecting film. Therefore, the light hardly leaks to the outside from the reflecting surface 47, and the optical coupling efficiency between the light emitting element 34 and the light receiving element 35 can be enhanced. This point will be described below with reference to FIGS. 6 to 8.

Figure 6:
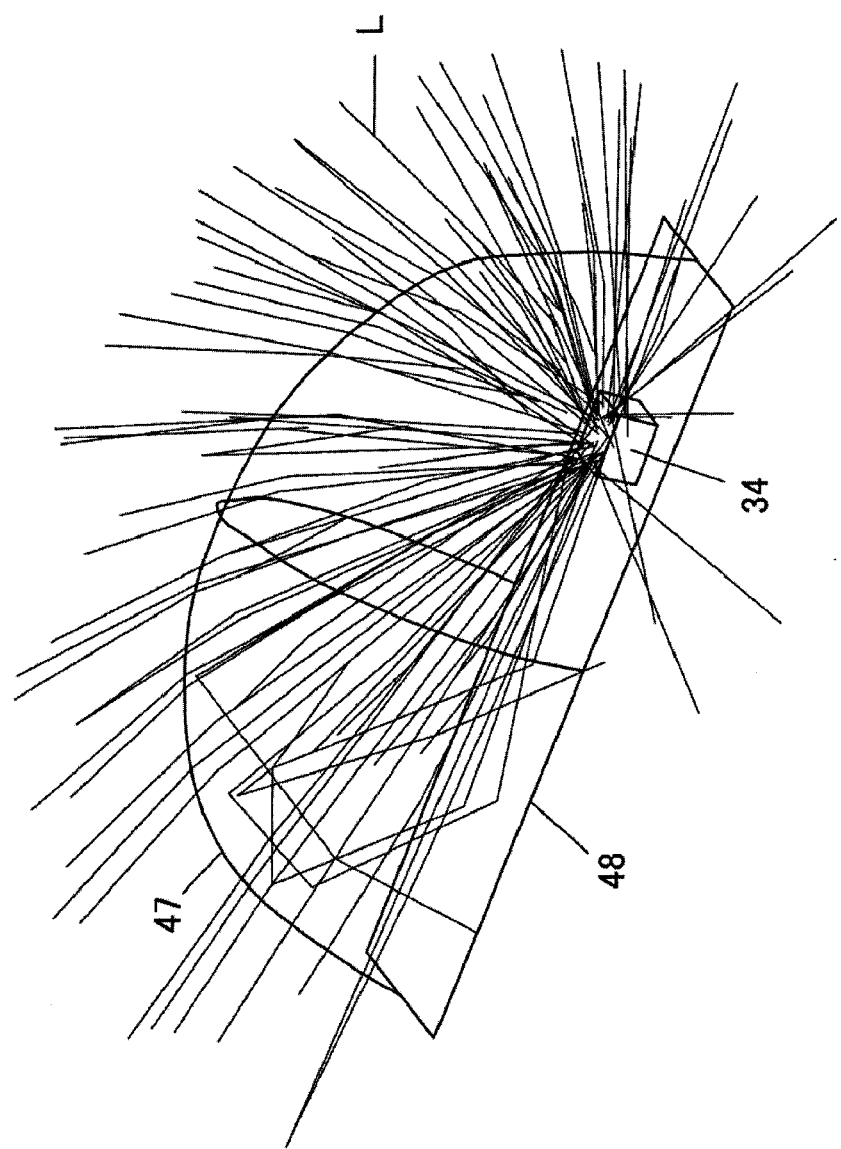
FIG. 6 is a view illustrating a behavior of the optical signal in a comparative example in which the light emitting element is disposed in a focal position.
Figure 8C:
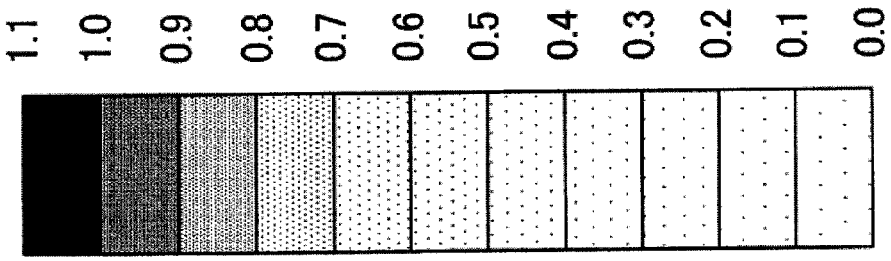
FIG. 8C illustrates an illuminance scale.
Figure 8A:
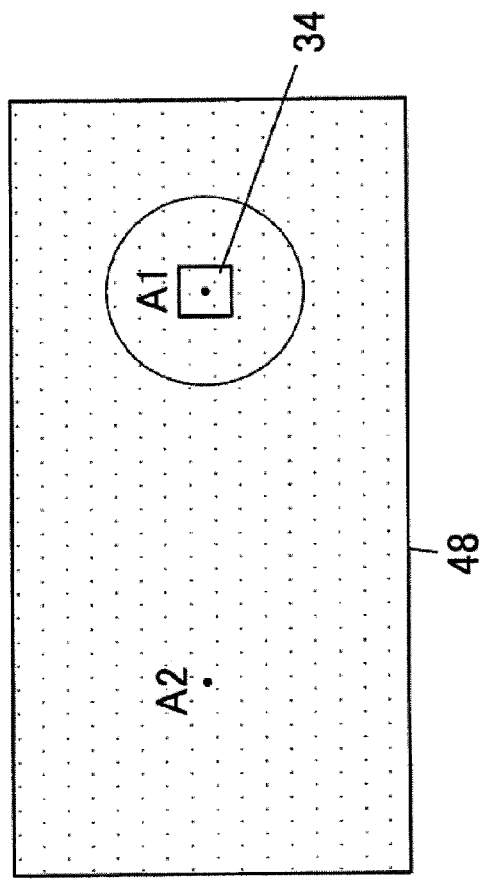
FIG. 8A is a view illustrating illuminance in a bottom surface of the comparative example illustrated in FIG. 6.

FIG. 6 illustrates a comparative example and a simulation result of a behavior of the light L emitted from the light emitting element 34 when the light emitting element 34 is disposed at the focal point A1 of the reflecting surface 47 (elliptical surface). FIG. 8A is a view illustrating a simulation result of a distribution of illuminance (light receiving intensity) in a rectangular region 48 located on the bottom surface of the primary mold portion 38. In the simulation, it is assumed that the refractive index of the primary mold portion 38 is set to ni=1.53 while the refractive index of the secondary mold portion 39 is set to no=1.31. When the light emitting element 34 is disposed at the focal point A1, most light is transmitted through the reflecting surface 47 to leak to the outside as illustrated in FIG. 6, and a high-illuminance region is not generated in the rectangular region 48 as illustrated in FIG. 8A.

Figure 7:
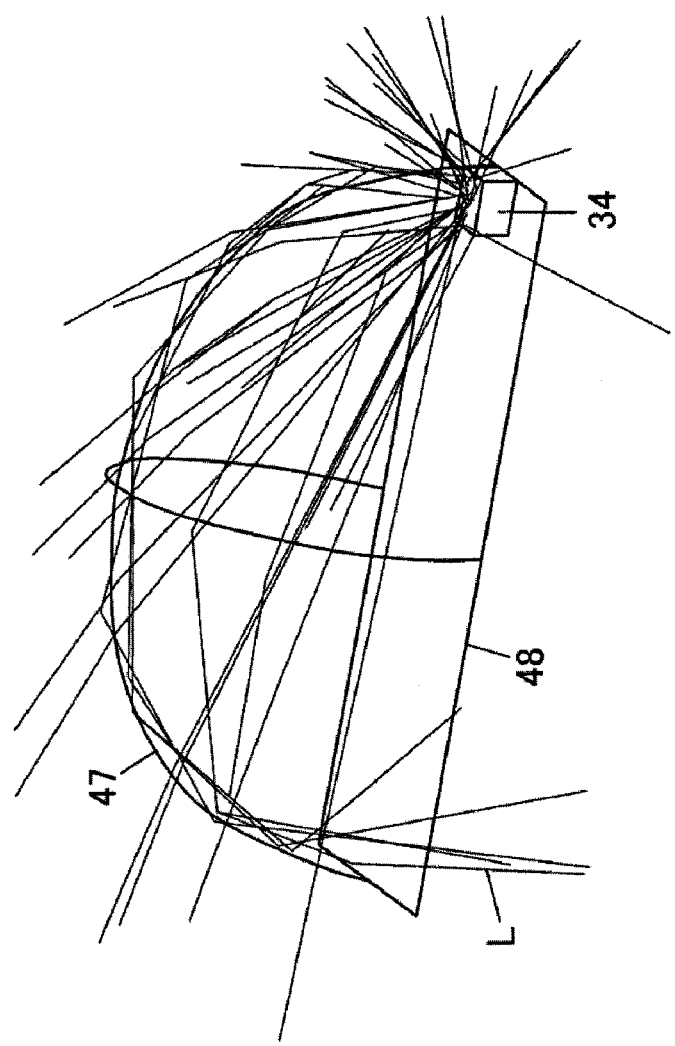
FIG. 7 is a view illustrating a behavior of the optical signal in the optical coupler of the first embodiment in which the light emitting element is disposed outside the focal position.
Figure 8B:
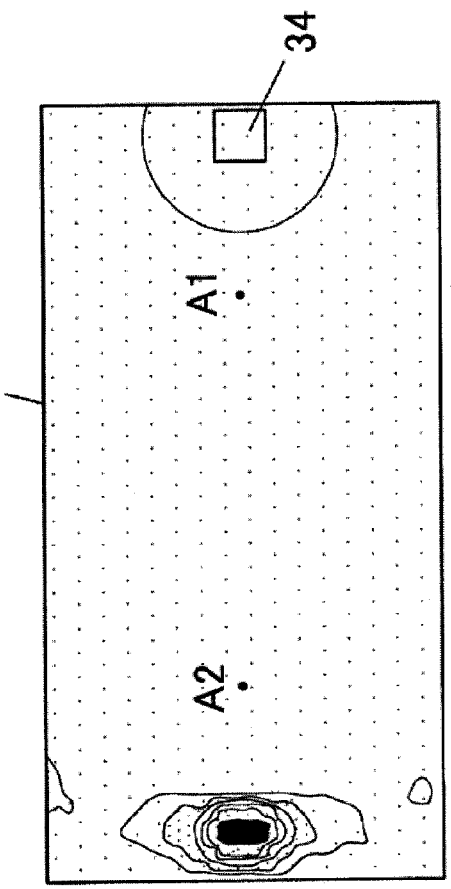
FIG. 8B is a view illustrating illuminance in the bottom surface of the optical coupler of the first embodiment illustrated in FIG. 7.

FIG. 7 illustrates a simulation result of a behavior of the light L emitted from the light emitting element 34 when the light emitting element 34 is disposed on the outside (that is, the side that is located farther from the center O and does not include the focal point A1) of the focal position A1. FIG. 8B is a view illustrating a simulation result of the distribution of illuminance in the rectangular region 48. In the simulation, it is assumed that the refractive index of the primary mold portion 38 is set to ni=1.53 while the refractive index of the secondary mold portion 39 is set to no=1.31, and it is assumed that the position of the light emitting element 34 is set to a position that is 1.8 times the focal distance α (that is, Xe=1.8α). When the light emitting element 34 is disposed on the outside of the focal point A1, the amount of light that is transmitted through the reflecting surface 47 to leak to the outside is decreased, and the high-illuminance region is generated on the outside (that is, the side that is located farther from the center O and does not include the focal point A2) of the focal point A2 as illustrated in FIG. 8B. Accordingly, when the light emitting element 34 is disposed on the outside of the focal point A1 while the light receiving element 35 is disposed on the outside of the focal point A2, the optical coupling efficiency can be enhanced in the optical coupler 31 having the structure in which the light is guided to the light receiving element 35 after totally reflected by the reflecting surface 47 with no use of the metallic reflecting film.

Generally, the light receiving element only has to have part of the light receiving region in the high-illuminance region. Therefore, a degree of freedom of the disposition is still high in the light receiving element even if the high-illuminance region is located outside the focal point A2. However, the light receiving element 35 has the structure in which the plural light receiving cells 46 are connected in series, and the electromotive force is decreased as a whole when the light receiving element 35 has some light receiving cells 46 that hardly receive the light. Accordingly, in the optical coupler 31 in which the light receiving element 35 is used, it is necessary that the light receiving element 35 be disposed such that the center of the light receiving region is located on the outside of the focal point A2.

An experimental result of a relationship between the positions of the light emitting element 34 and light receiving element 35 and the light receiving amount of the light receiving element 35 in the primary mold portion 38 will be described below. In the primary mold portion 38 used in the experiment, the interface with the secondary mold portion 39 was formed into a substantial elliptical shape, and the elliptical shape had a radius of 2.0 mm in a longitudinal direction (X-axis direction) (that is, the primary mold portion 38 having a total length of 4.0 mm in the longitudinal direction). The position of the light emitting element 34 was changed on the X-axis in each measurement such that a distance from the center of the ellipsoid became 1.5 mm. 1.6 mm, 1.7 mm, and 1.8 mm. The light receiving element 35 was disposed at a symmetrical position of the light emitting element 34 in relation to the X-axis. That is, the light receiving element was disposed across the center of the ellipsoid from the light emitting element 34, and the light receiving element 35 was disposed such that the distance from the center of the ellipsoid is equal to that of the light emitting element 34. When the light emitting element 34 and the light receiving element 35 are disposed farther than 1.8 mm from the center of the ellipsoid, the measurement cannot be performed because one of the light emitting element 34 and the light receiving element 35 runs out from the primary mold portion 38. Therefore, the light receiving amount is not measured in the position that is farther than 1.8 mm from the center of the ellipsoid.

The light emitting element 34 having a light emitting amount of 7.738 mW was used in the measurement. The positions (the distance from the center of the ellipsoid) of the light emitting element 34 and light receiving element 35 were changed to 1.5 mm. 1.6 mm, 1.7 mm, and 1.8 mm, and the light receiving amount of the light receiving element 35 was measured in each position. Table 1 illustrates measured light receiving amounts. Table 1 also illustrates a value of transmission efficiency (optical coupling efficiency) computed by transmission efficiency=(light receiving amount/light emitting amount)×100[%].

TABLE 1

| Position of the light emitting element [mm] | 1.5 | 1.6 | 1.7 | 1.8 |
|---|---|---|---|---|
| Light receiving amount [mW] | 0.005 | 0.023 | 0.278 | 1.733 |
| Transmission efficiency [%] | 0.1 | 0.3 | 3.6 | 22.4 |

Figure 9:
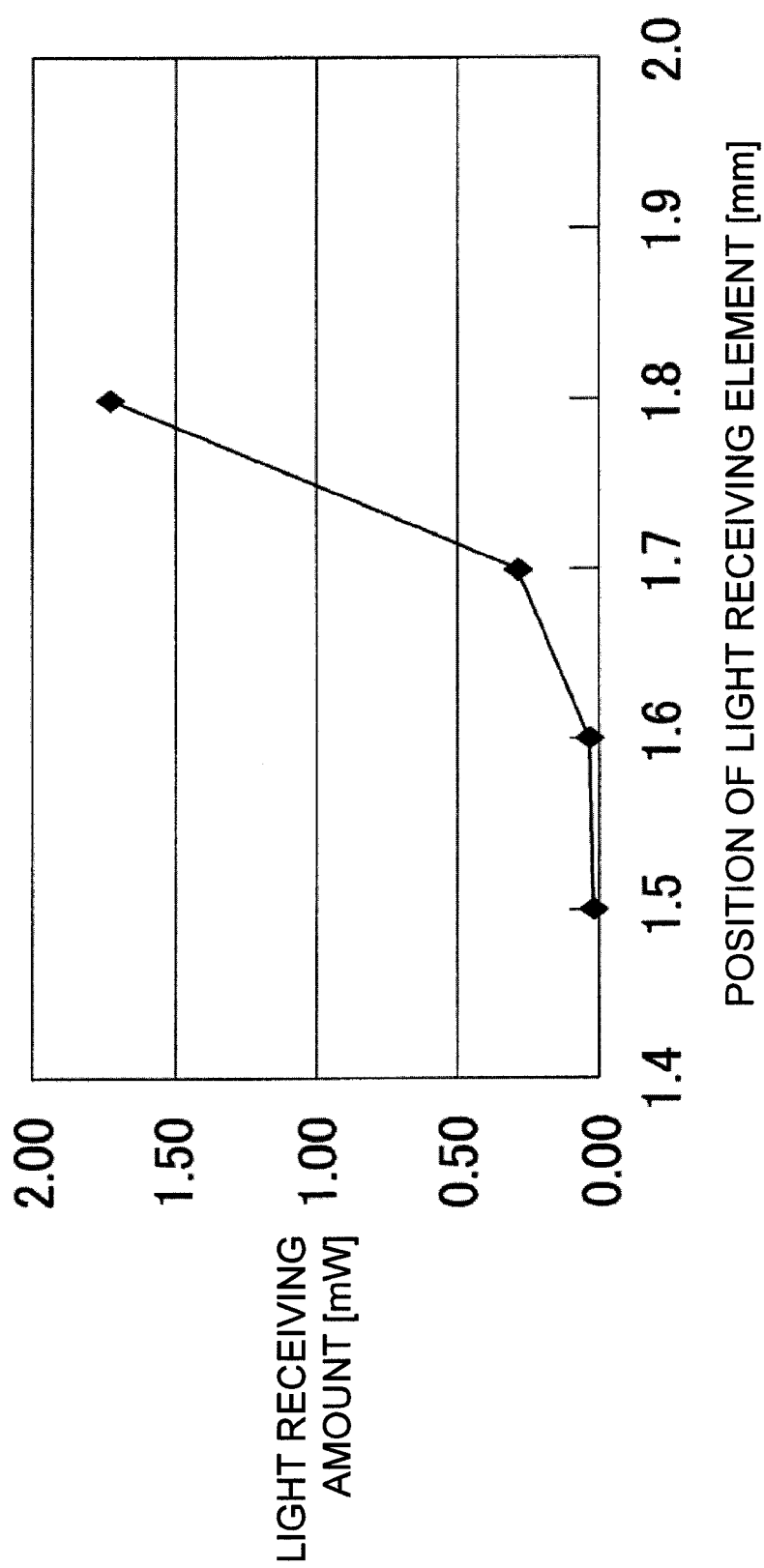
FIG. 9 is a view illustrating measurement result of a light receiving amount of the light receiving element that is disposed in a symmetric position by changing a position of the light emitting element.
Figure 10:
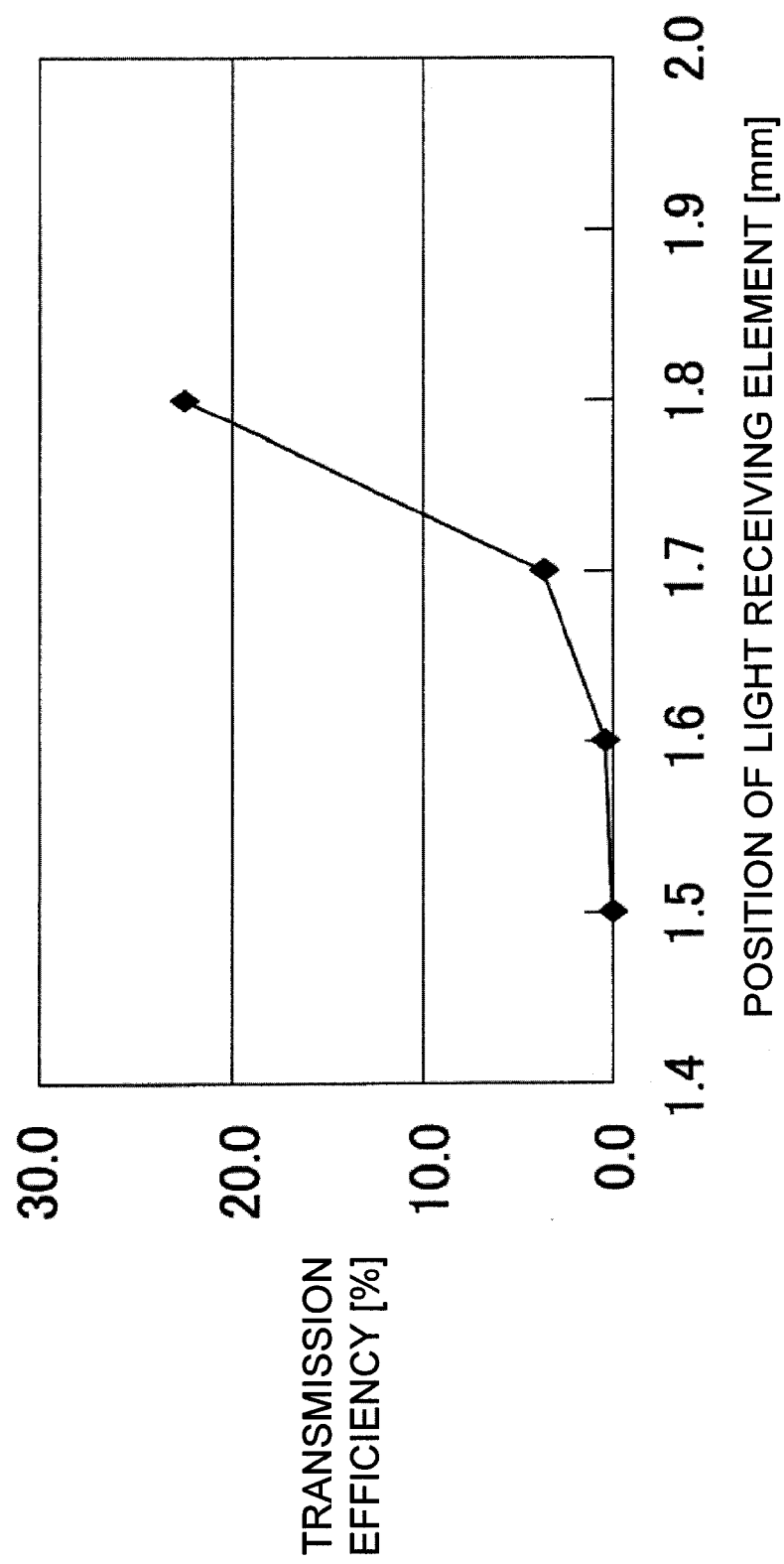
FIG. 10 is a view illustrating result in which transmission efficiency is obtained based on measurement result of FIG. 9.

FIG. 9 is a graph illustrating the relationship between the position of the light emitting element 34 (and light receiving element 35) and the light receiving amount of Table 1. FIG. 10 is a graph illustrating the relationship between the position of the light emitting element 34 (and light receiving element 35) and the transmission efficiency. As can be seen from FIGS. 9 and 10, when the light emitting element 34 and the light receiving element 35 are brought close to the surface of the primary mold portion 38, the light receiving amount is rapidly increased to obtain the good transmission efficiency (optical coupling efficiency).

Figure 11:
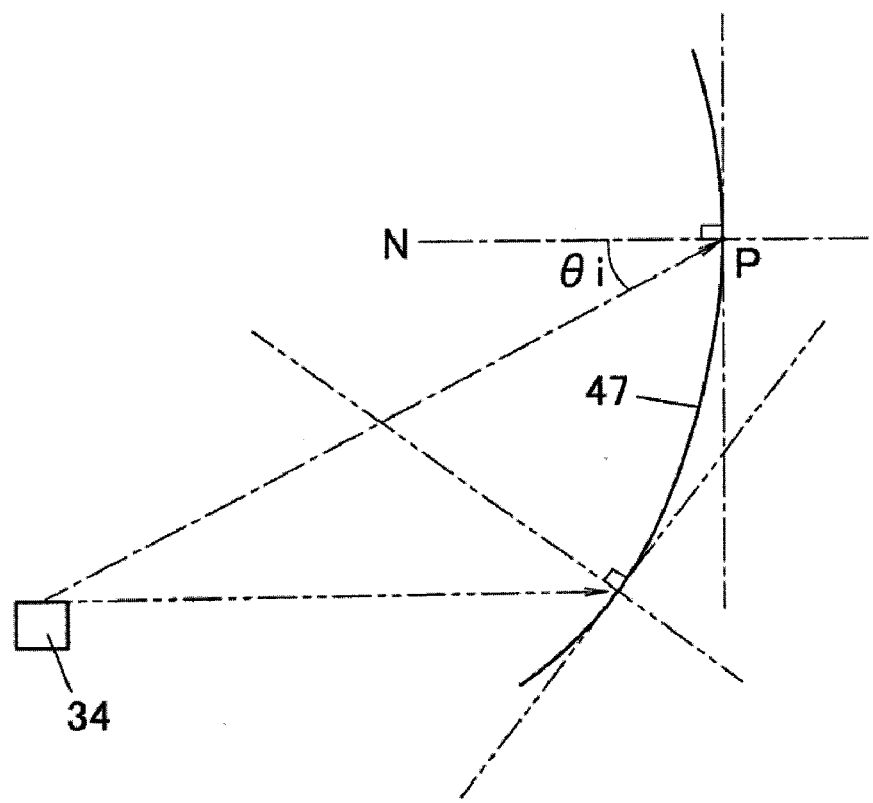
FIG. 11 is a schematic diagram explaining a way to decide on a shape of an interface between a primary mold portion and a secondary mold portion.
Figure 12:
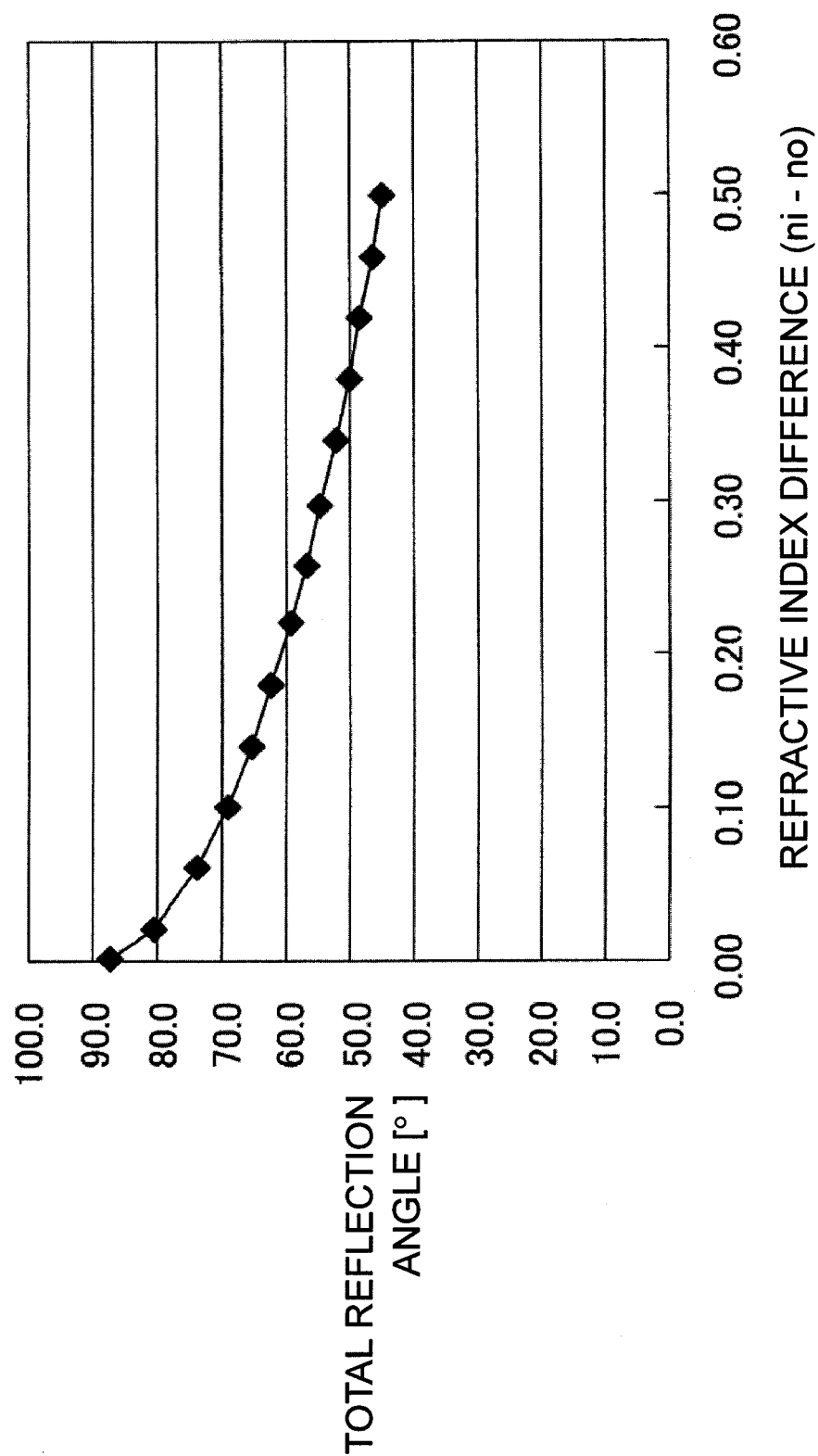
FIG. 12 is a view illustrating a relationship between a difference in refractive index between the primary mold portion and the secondary mold portion and a total reflection angle at the interface between molding resins.

The surface shape (the shape of the reflecting surface 47) of the primary mold portion 38 may slightly be deformed from the elliptical surface. For example, the surface of the primary mold portion 38 may be deformed as follows such that the light emitted from the light emitting element 34 is totally reflected in the region of the reflecting surface 47 as large as possible. As illustrated in FIG. 11, assuming that θi [°] is an incident angle of the light L incident to a line N normal to a point P in the surface of the primary mold portion 38, the light L is totally reflected by the reflecting surface 47 under the following condition: $\theta i \geq \arcsin(no/ni) \times (180/\pi)$ (Formula 1). Where ni is the refractive index of the primary mold portion 38, no is the refractive index of the secondary mold portion 39, and ni>no. When $\theta i = \arcsin(no/ni) \times (180/\pi)$ (Formula 2) holds, the incident angle is referred to as a total reflection angle. A graph illustrated in FIG. 12 is obtained when the total reflection angle is expressed by a relationship with a refractive index difference ni−no. Accordingly, at the point that does not satisfy the condition of Formula 1 when the surface of the primary mold portion 38 is formed into the elliptical surface, the position of the light emitting element 34 or the surface shape of the primary mold portion 38 may be corrected such that Formula 1 is satisfied as much as possible.

(Producing Process)

A process of producing the optical coupler 31 will be described below.

(1) The lead frames 32, 33, 41, and 42 having the desired shapes are formed by punching or etching a hoop material having excellent electric conductivity and thermal conductivity (for example, copper material, iron material, and 42 alloy). The plating treatment (for example, Ag plating on Cu base) is performed to the inner leads of the lead frames 32, 33, 41, and 42 in order to improve the wire bonding property. Alternatively, Au plating may be performed to a Ni/Pd base). Then, the light emitting element 34 and the light receiving element 35 are mounted on the element mounting portions 32a and 33a by a conductive adhesive (for example, Ag paste, that is, an epoxy resin including Ag particles) with an apparatus such as a die bonder. For the conductive adhesive, thermal curing is performed in an oven at about 100 to about 150° C. Sometimes the light receiving element 35 is bonded to (mounted on) the element mounting portion 33a by eutectic bonding.

(2) The wire bond pad of the light emitting element 34 and the lead frame 41 are connected by the bonding wire 36 using an apparatus such as wire bonder. The wire bond pads 43 and 44 of the light receiving element 35 and the lead frame 42 are connected by the bonding wire 37 using the wire bonder. At this point, the wire bonding is performed at a temperature of about 180 to about 250° C. in order to improve the wire bonding property.

Figure 13:
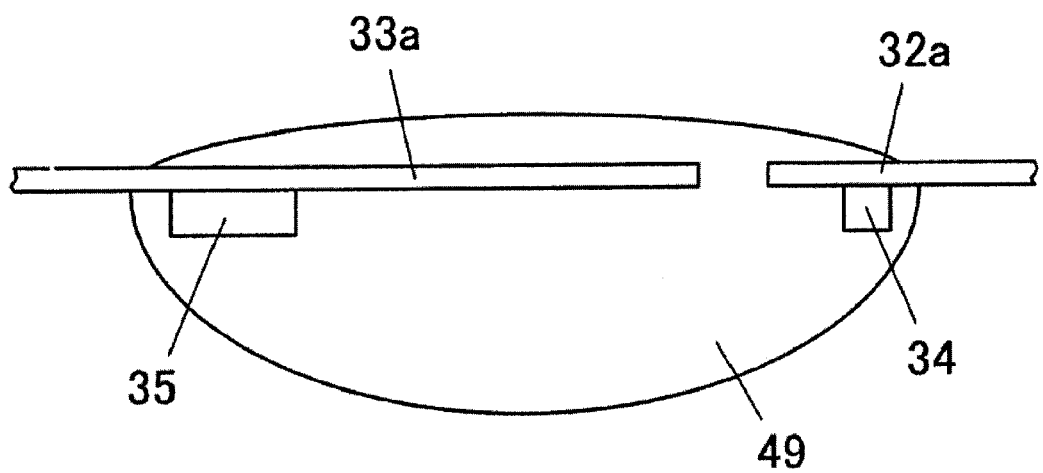
FIG. 13 is a schematic diagram illustrating one process in producing the optical coupler of the first embodiment.

(3) In order to optically couple the light emitting element 34 and the light receiving element 35, the translucent resin, such as the silicone resin, the acrylic resin, and the urethane resin in which viscosity is adjusted in a fluidized state, is applied onto the element mounting portions 32a and 33a using an apparatus such as a dispenser such that the light emitting element 34 and the light receiving element 35 are covered with the translucent resin 49. Then, as illustrated in FIG. 13, the lead frames 32, 33, 41, and 42 are vertically inverted. When the lead frames 32, 33, 41, and 42 are vertically inverted, the translucent resin 49 hangs due to gravity so as to becomes a half of the spheroid. At this point, when the element mounting portions 32a and 33a have the rectangular shape, the translucent resin 49 is attracted to corner portions of the element mounting portions 32a and 33a, and the translucent resin 49 is deformed to hardly become the smooth elliptical shape. However, in the first embodiment, because element mounting portions 32a and 33a are formed into the elliptical shape as illustrated in FIG. 3, the translucent resin 49 that hangs from the lower surfaces of the element mounting portions 32a and 33a becomes the substantially elliptical shape. When the translucent resin 49 is a thermosetting resin, the translucent resin 49 is cured by heating the translucent resin 49 for 1 to 2 hours at a temperature bout 100 to about 150° C. The cured translucent resin 49 constitutes the primary mold portion 38. The surface shape of the translucent resin 49 can be controlled by the viscosity or application amount of the translucent resin 49.

(4) The secondary mold portion 39 is molded while the surface of the primary mold portion 38 is covered with the translucent resin having a refractive index lower than that of the translucent resin 49. The outsides of the primary mold portion 38 and secondary mold portion 39 are sealed by a thermosetting resin (epoxy resin) to mold the sealing resin using a transfer molding machine. At this point, a die temperature ranges from about 160 to about 180° C. In order to completely cure the sealing resin 40, the sealing resin 40 is heated to perform after-curing for 3 to 8 hours at a temperature of 100 to 150° C.

(5) A thick film that is formed between the sealing resin 40 and tie bars of the lead frames 32, 33, 41, and 42 in molding the sealing resin 40 is punched out, and the tie bars of the lead frames 32, 33, 41, and 42 are punched out. Thin burrs formed in molding in the surfaces of the lead frames 32, 33, 41, and 42 are removed by electrolytic burring or blasting. Then the outer leads of the lead frames 32, 33, 41, and 42 are exterior-plated by solder or lead-free plating. The lead frames 32, 33, 41, and 42 are cut into predetermined lengths by a die and folded, and separated from the hoop material.

(6) Finally, the optical coupler 31 (product) is tested with a semiconductor tester or the like to discriminate between a non-defective item and a defective item, and the non-defective item is packed according to a packaging mode while the defective item is picked out. For example, when a mounter is used in the mounting, the optical coupler 31 is packed by a tape reel.

When the optical coupler 31 is produced in the above-described way, because the primary mold portion 38 can be molded into the substantially elliptical shape with no use of the molding die, production efficiency of the optical coupler 31 is improved, and the production cost can be reduced.

Second Embodiment

Figure 14A:
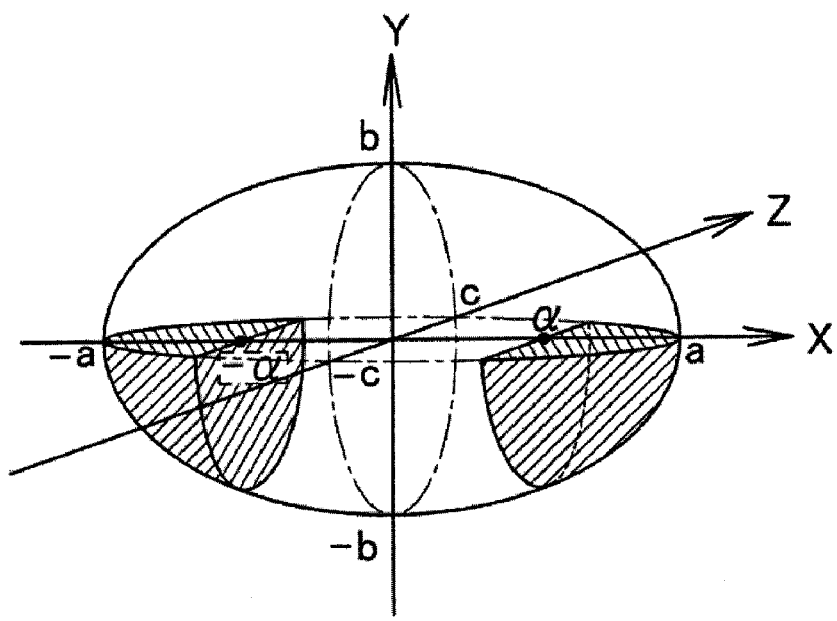
FIGS. 14A and 14B are a perspective view and a sectional view illustrating a region where the light emitting element and the light receiving element can be disposed in an optical coupler according to a second embodiment of the invention.
Figure 14B:
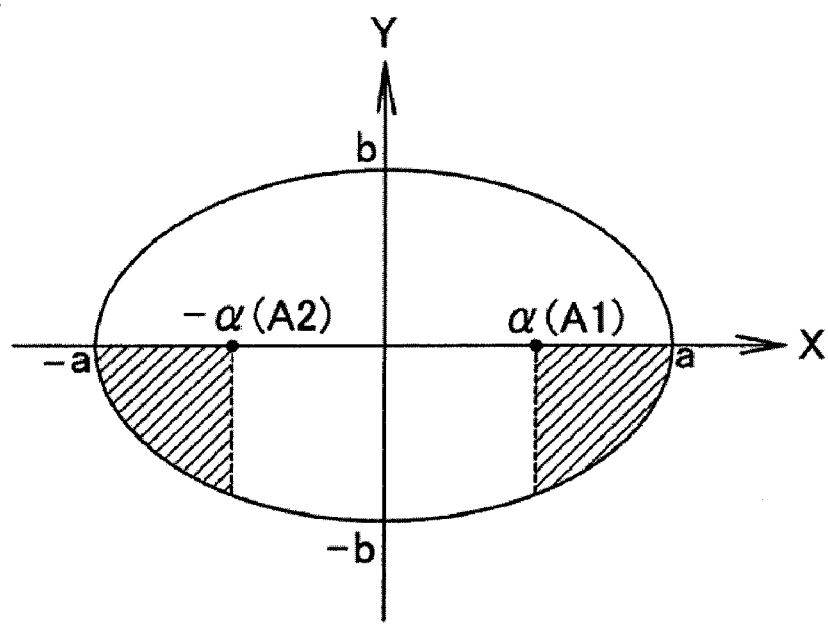

In an optical coupler according to a second embodiment of the invention, the light emitting element 34 and the light receiving element 35 are provided in a position that deviates from the X-axis, that is, a region that is shaded in FIGS. 14A and 14B. In the second embodiment, the Y-axis of the spheroid approximating the primary mold portion 38 is oriented toward the direction perpendicular to the element mounting portion 32a (that is, the height direction of the primary mold portion 38), and the X-axis and the Z-axis are oriented an arbitrary direction parallel to the element mounting portion 32a. The light emitting element 34 is located in a region where the emission point of the light emitting element 34 satisfies the following conditions:

$(X/a)^2+(Y/b)^2+(Z/c)^2 \leq 1$ $\alpha a < X \leq a$ $Y < 0$

The region is a shaded region on the right of FIGS. 14A and 14B. The light receiving element 35 is located in a region where the light receiving region of the light receiving element 35 satisfies the following conditions:

$(X/a)^2+(Y/b)^2+(Z/c)^2 \leq 1$ $-a \leq X < -\alpha$ $Y < 0$

The region is a shaded region on the left of FIGS. 14A and 14B. Where a is a radius in the X-axis direction of the spheroid, b is a radius in the Y-axis direction, c is a radius in the Y-axis direction, and $\alpha = \sqrt{(a^2-b^2)}$.

An XZ-plane of the spheroid is parallel to the element mounting portion 32a. Hereinafter sometimes a surface parallel to the upper surface of the element mounting portion 32a is referred to as a horizontal surface when the upper surface of the element mounting portion 32a is taken as a reference. The light emitting element 34 and the light receiving element 35 are mounted on surfaces of the element mounting portions 32a and 33a. The surfaces of the element mounting portions 32a and 33a face the XZ-plane (Y=0). That is, the light emitting element 34 and light receiving element 35 are located in a lower hemisphere of the spheroid as illustrated in FIGS. 14A and 14B. The light emitting element 34 and the light receiving element 35 are mounted on the upper surfaces of the element mounting portions 32a and 33a such that the distance in which the light guided from the light emitting element 34 to the light receiving element 35 is lengthened.

Figure 15:
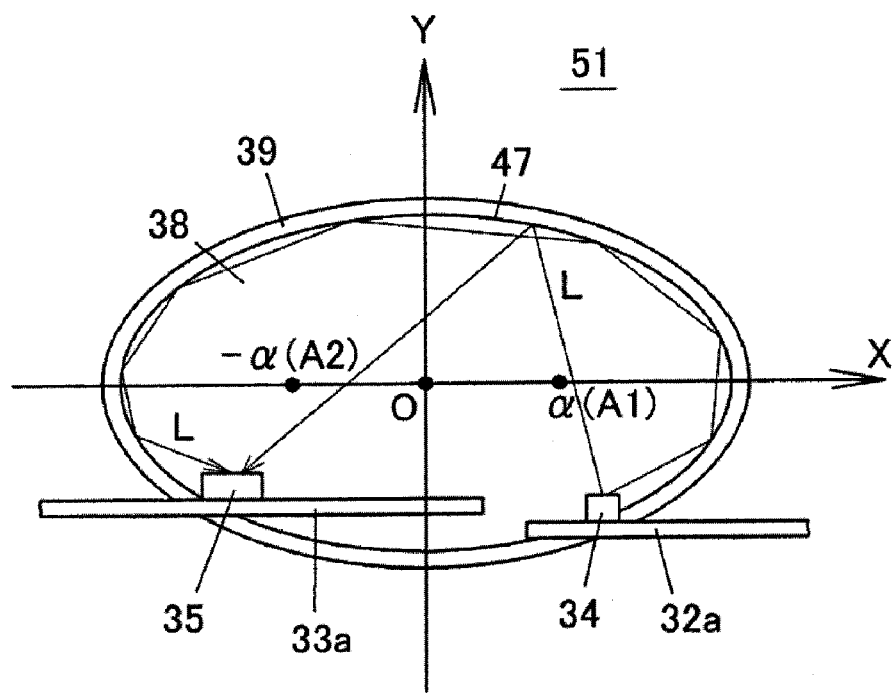
FIG. 15 is a schematic sectional view illustrating an example of the optical coupler of the second embodiment.

FIG. 15 illustrates an example of an optical coupler 51 of the second embodiment. In the optical coupler 51, the light emitting element 34 and the light receiving element 35 are disposed in the XY-plane, the light emitting element 34 mounted on the upper surface of the element mounting portion 32a is disposed below the X-axis on the outside of the focal point A1, and the light receiving element 35 mounted on the upper surface of the element mounting portion 33a is disposed below the X-axis on the outside of the focal point A2. Correctly, assuming that (Xe, Ye, Ze) is a coordinate of the emission point of the light emitting element 34, $(Xe/a)^2+(Ye/b)^2+(Ze/c)^2 \leq 1$, $\alpha<Xe\leq a$, $Ye<0$, and $Ze=0$ hold. Assuming that (Xr, Yr, Zr) is a coordinate of the emission point of the light receiving element 35, $(Xr/a)^2+(Yr/b)^2+(Zr/c)^2 \leq 1$, $-\alpha \leq Xr<-\alpha$, $Yr<0$, and $Zr=0$ hold.

In the structure of the second embodiment, as illustrated in FIG. 14, the light emitted from the light emitting element 34 can totally be reflected one or plural times by the reflecting surface 47. Therefore, the optical coupling efficiency between the light emitting element 34 and the light emitting element 35 can be enhanced with no use of the metallic reflecting film.

In the second embodiment, the light emitting element 34 can be disposed in the position that deviates from the XY-plane. In one or more embodiments of the invention, the light receiving element 35 is disposed on the opposite side to the light emitting element 34 in relation to the XY-plane.

Third Embodiment

Figure 16:
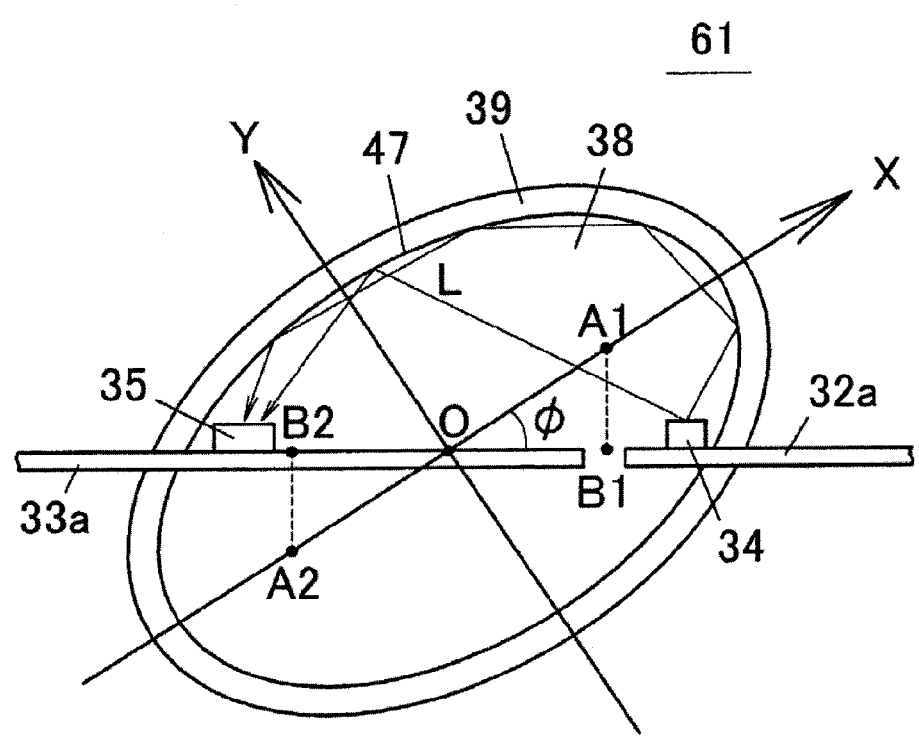
FIG. 16 is a schematic sectional view of an optical coupler according to a third embodiment of the invention.

FIG. 16 is a schematic sectional view illustrating an optical coupler 61 according to a third embodiment of the invention. In the third embodiment, the Z-axis of the spheroid approximating the primary mold portion 38 is parallel to the horizontal surface, and the X-axis and the Y-axis are rotated about the Z-axis by $\phi$ from a surface perpendicular to the horizontal surface. The element mounting portions 32a and 33a are located on the horizontal surface passing through the center O of the spheroid. The emission center of the light emitting element 34 exists in the XY-plane, and the light emitting element 34 is disposed farther away from the center O than a point B1 at which the focal point A1 on the X-axis is projected perpendicular to the horizontal surface passing through the center O. Similarly, the center of the light receiving region of the light receiving element 35 is located on the XY-plane, and the light receiving region 35 is located farther away from the center O than a point B2 at which the focal point A2 on the X-axis is projected perpendicular to the horizontal surface passing through the center O.

When the spheroid is inclined, the incident angle at which the light emitted toward the opposite side to the light receiving element 35 is incident to the reflecting surface 47 can be increased in the light L emitted from the light emitting element 34, so that the leakage of the light can be reduced to improve use efficiency of the light. Because the angle of the spheroid is used as the design parameter, the degree of freedom of the design is enhanced.

Figure 17:
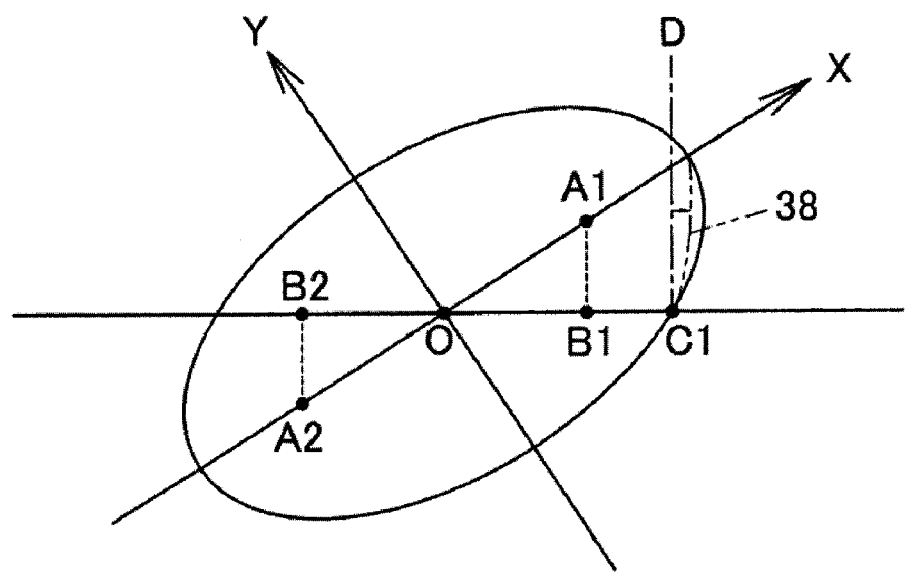
FIG. 17 is a view illustrating a condition that a surface of a primary mold portion is deformed from an inclined spheroid.

As described above, the surface of the primary mold portion 38 may slightly be deformed from the spheroid. In such cases, when the original spheroid is inclined with respect to the horizontal surface, the following care and attention are required. That is, as illustrated in FIG. 17, assuming that c1 is an intersection point of the spheroid in the XY-plane and the horizontal surface passing through the center O and D is a plane that passes through the C1 and is perpendicular to both the horizontal surface and the XY-plane, it is necessary that the primary mold portion 38 have a portion that runs out to the outside of the plane D.

Figure 18:
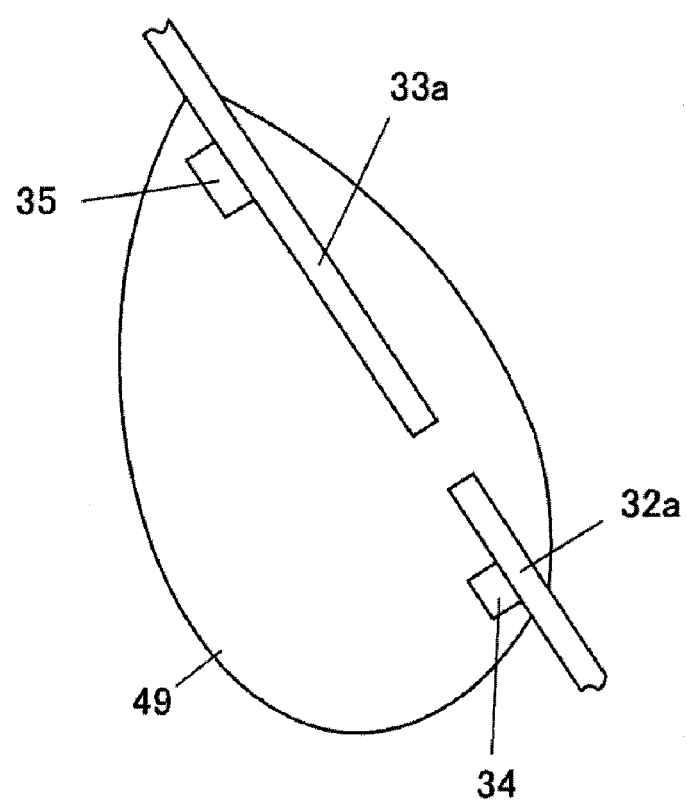
FIG. 18 is a schematic diagram illustrating one process in producing the optical coupler of the third embodiment.

The optical coupler of the third embodiment in which the spheroid is inclined can be produced in the way similar to that of the first embodiment. Particularly, in the process of molding the primary mold portion 38 using the translucent resin 49, as illustrated in FIG. 18, the lead frames 32, 33, 41, and 42 may be inclined while vertically inverted. At this point, because the gravity direction becomes the long-axis direction of the spheroid, the inclination of the spheroid can be adjusted by the inclination angle of the lead frame. The shape of the spheroid can be controlled by the application amount and viscosity of the translucent resin 49.

Fourth Embodiment

Figure 19:
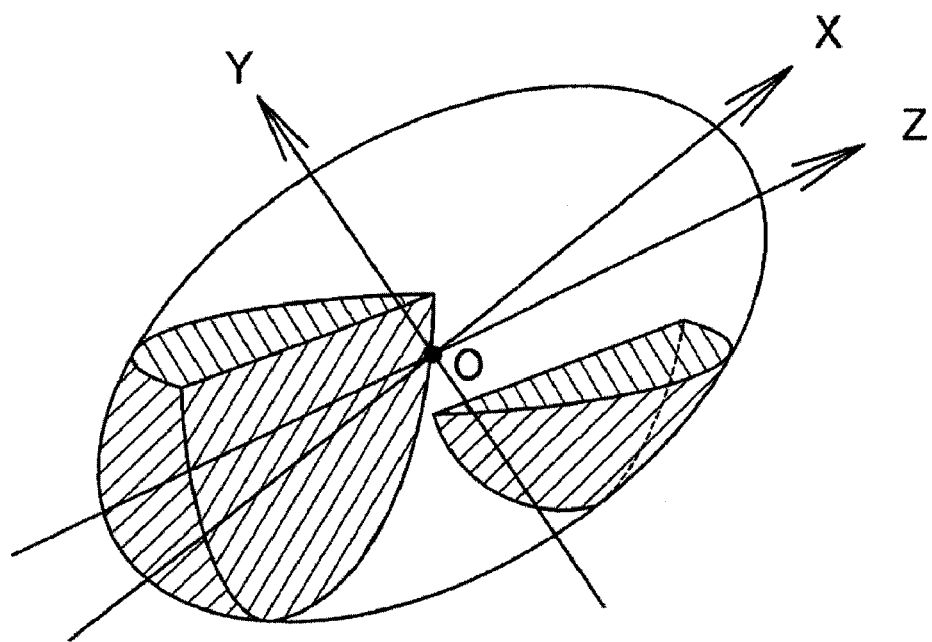
FIG. 19 is a perspective view illustrating a region where the light emitting element and the light receiving element can be disposed in the optical coupler of a fourth embodiment of the invention.
Figure 20A:
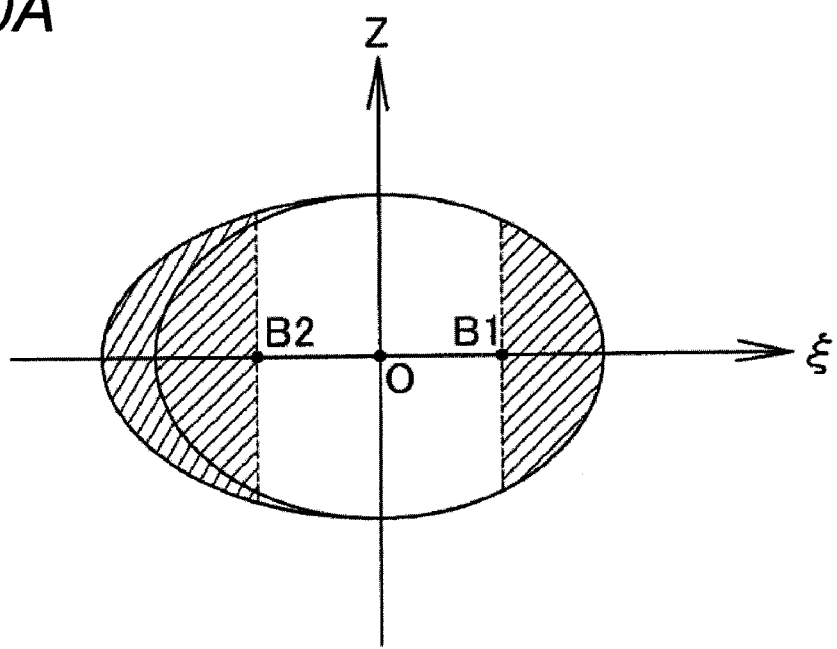
FIGS. 20A and 20B are sectional views illustrating a region where the light emitting element and the light receiving element can be disposed in an optical coupler according to a second embodiment of the invention.
Figure 20B:
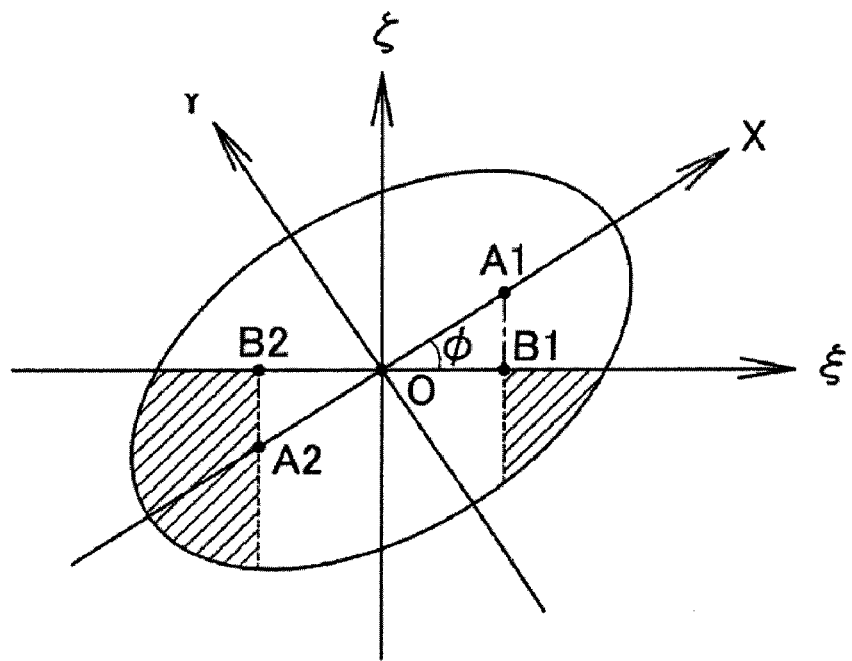

In an optical coupler according to a fourth embodiment of the invention, in the primary mold portion 38 that becomes the inclined spheroid, the light emitting element 34 and the light receiving element 35 are disposed in a position that deviates from the horizontal surface passing through the center O, that is, a region that is shaded in FIGS. 19, 20A and 20B.

As illustrated in FIGS. 19 and 20, the Z-axis of the spheroid is parallel to the horizontal surface, and the spheroid is inclined while rotated about the Z-axis by the angle $\phi$. At this point, in the XY-plane, it is assumed that $\xi$-axis is an axis that passes through the center O in parallel with the horizontal surface, and it is assumed that a $\zeta$-axis is an axis that passes through the center O and is perpendicular to the horizontal surface.

The shaded region in FIGS. 19 and 20 passes the focal points A1 and A2 on the X-axis of the spheroid, and the shaded region is located on the outside (that is, the side farther from the center O) of the surface parallel to the $\zeta Z$-plane. When the light emitting element 34 and the light receiving element 35 are mounted on the upper surfaces of the element mounting portions 32a and 33a, the light emitting element 34 and the light receiving element 35 are located below the horizontal surface ($Z\xi$-plane) passing through the center O such that the light guide distance is lengthened. One of the regions is a region satisfying expressions of $(X/a)^2+(Y/b)^2+(Z/c)^2 \leq 1$;

$\alpha \cos \phi < \xi$, and $\zeta < 0$, and the emission center of the light emitting element 34 is located in the region satisfying the expressions. The other region is a region satisfying expressions of $(X/a)^2+(Y/b)^2+(Z/c)^2 \leq 1$, $\xi < -\alpha \cos \phi$, and $\zeta < 0$, and the light center of the receiving region of the light receiving element 35 is located in the region satisfying the expressions.

Figure 21:
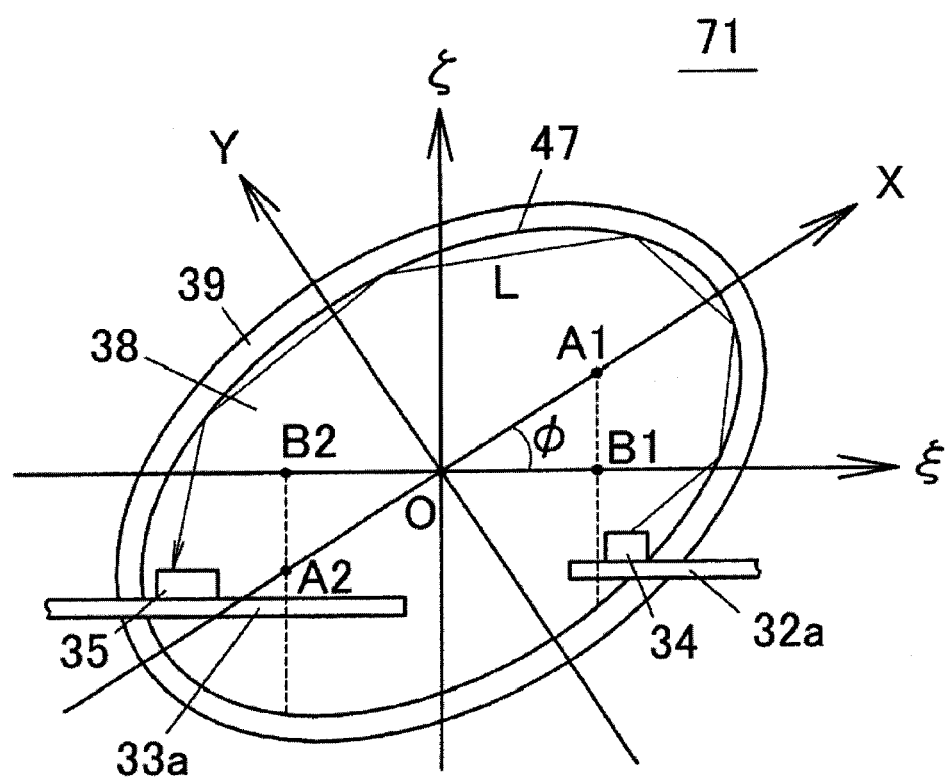
FIG. 21 is a schematic sectional view illustrating an example of the optical coupler of the fourth embodiment.

FIG. 21 illustrates an example of an optical coupler 71 of the fourth embodiment. In the optical coupler 71 of the fourth embodiment, the light emitting element 34 and the light receiving element 35 are disposed in the XY-plane. The light emitting element 34 mounted on the upper surface of the element mounting portion 32a is disposed below the $\xi Z$-plane on the outside of the perpendicular surface that is parallel to the $\zeta Z$-plane and passes through the point B1 at which the focal point A1 is projected to the horizontal surface. The light receiving element 35 mounted on the upper surface of the element mounting portion 33a is disposed below the $\xi Z$-plane on the outside of the perpendicular surface that is parallel to the $\zeta Z$-plane and passes through the point B2 at which the focal point A2 is projected to the horizontal surface.

In the structure of the fourth embodiment, as illustrated in FIG. 21, the light emitted from the light emitting element 34 can totally be reflected one or plural times by the reflecting surface 47. Therefore, the optical coupling efficiency between the light emitting element 34 and the light emitting element 35 can be enhanced with no use of the metallic reflecting film.

In the fourth embodiment, the light emitting element 34 can be disposed in the position (that is, Ze≠0) that deviates from the XY-plane. In one or more embodiments of the invention, the light receiving element 35 is disposed on the opposite side to the light emitting element 34 in relation to the XY-plane.

Fifth Embodiment

Figure 22:
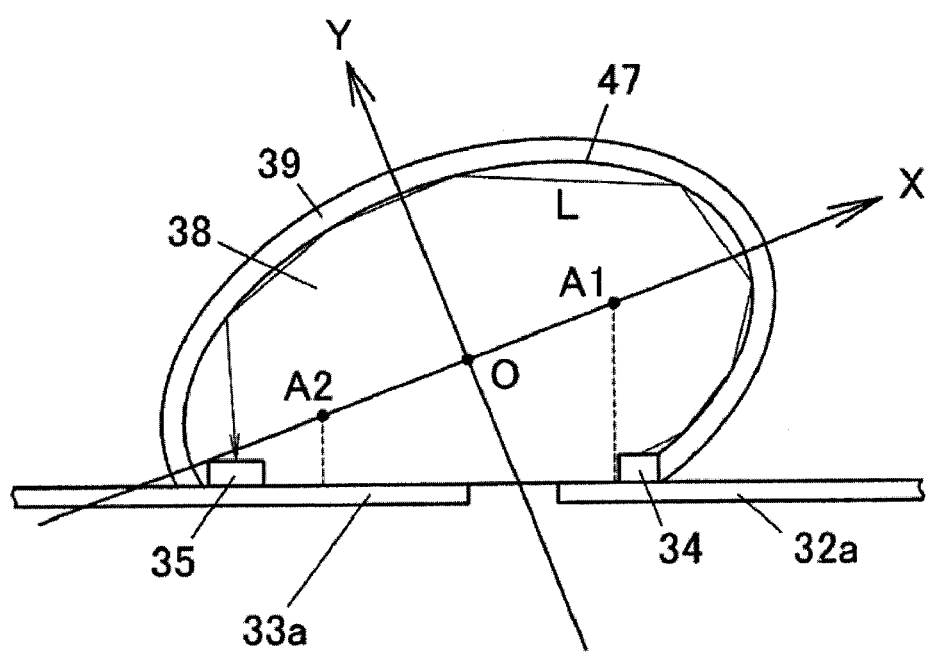
FIG. 22 is a schematic sectional view of an optical coupler according to a fifth embodiment of the invention.

FIG. 22 is a schematic sectional view illustrating an optical coupler 81 according to a fifth embodiment of the invention. In the fifth embodiment, the light emitting element 34 is disposed so as to be buried in the secondary mold portion 39. As a result, in the light L emitted from the light emitting element 34, the light emitted toward the opposite side to the light receiving element 35 is easily guided along the reflecting surface 47, and the leakage of the light can be reduced.

Sixth Embodiment

Figure 23:
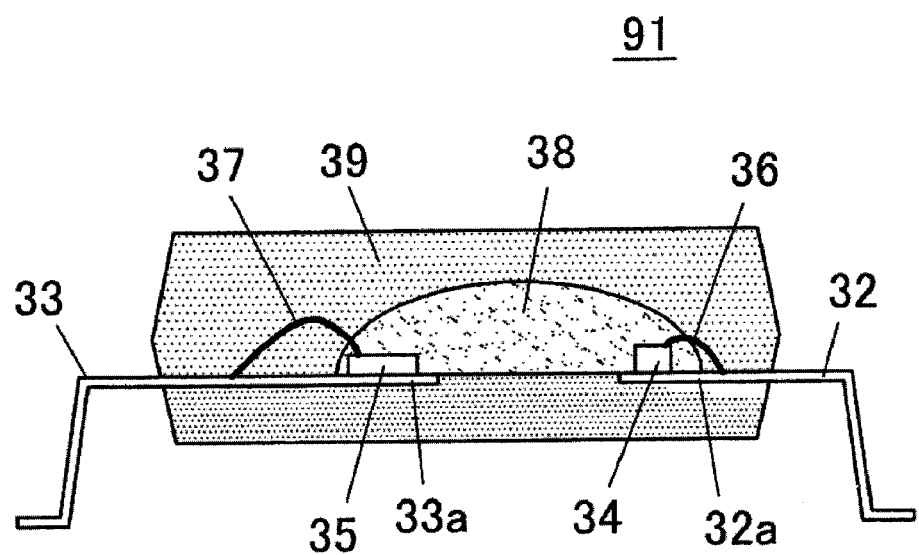
FIG. 23 is a sectional view of an optical coupler according to a sixth embodiment of the invention.

FIG. 23 is a sectional view of an optical coupler 91 according to a sixth embodiment of the invention. In the sixth embodiment, the light emitting element 34 and the light receiving element 35 are covered with the translucent primary mold portion 38, and the surface of the primary mold portion 38 is formed into the substantially elliptical surface. The substantially whole optical coupler 91 except the end portions of the lead frames 32, 33, 41, and 42 is sealed by the translucent secondary mold portion 39 having the refractive index lower than that of the primary mold portion 38. In the sixth embodiment, the light emitted from the light emitting element 34 is received by the light receiving element 35 after totally reflected at the interface between the primary mold portion 38 and the secondary mold portion 39. According to the sixth embodiment, the coast can further be reduced because the package structure of the optical coupler 9 can be simplified rather than the optical coupler of the first embodiment.

In one or more embodiments of the present invention, the primary mold portion 38 can be approximated by the part or whole of the three-dimensional spheroid. Alternatively, the surface of the primary mold portion 38 may be formed into a low-dimensional elliptical surface. For example, like Japanese Patent Publication Laid-Open No. 5-218491, the surface of the primary mold portion 38 is formed into the elliptical shape when viewed from the side face, and the outline of the primary mold portion 38 may be formed into the rectangular shape when viewed from the front face or upper surface.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A optical coupler comprising:
a first conversion element that converts an electric signal into an optical signal mounted on a surface of a first terminal plate; and
a second conversion element that converts the optical signal into the electric signal are mounted on a surface of a second terminal plate,
wherein the surface of the first terminal plate and the surface of the second terminal plate are oriented toward an identical direction,
wherein the first conversion element and the second conversion element are covered with a translucent primary mold resin,
wherein a surface of the primary mold resin is covered with a secondary mold resin having a refractive index lower than that of the primary mold resin,
wherein the first conversion element and the second conversion element are optically coupled by totally reflecting the optical signal emitted from the first conversion element at an interface between the primary mold resin and the secondary mold resin,
wherein the surface of the primary mold resin is formed into an elliptical surface,
wherein an emission center of the first conversion element is located on a side farther away from a center of the elliptical surface than a plane perpendicular to a plane that passes through one of focal points on an axis on which the elliptical surface exists, is perpendicular to a surface in which the first conversion element is mounted on the first terminal plate and a plane including the axis, and the surface in which the first conversion element is mounted on the first terminal plate, and
wherein a center of a light receiving region of the second conversion element is located on a side farther away from the center of the elliptical surface than a plane perpendicular to a plane that passes through the other focal points on the axis, is perpendicular to a surface in which the first conversion element is mounted on the first terminal plate and the plane including the axis, and the surface in which the first conversion element is mounted on the first terminal plate.

2. The optical coupler according to claim 1, wherein the first conversion element and the second conversion element are mounted on surfaces of the first conversion element and the second conversion element, respectively, the surfaces of the first conversion element and the second conversion element being located opposite a surface parallel to the surface on which the first conversion element of the first terminal plate is mounted.

3. The optical coupler according to claim 1, wherein the axis is a long axis of the elliptical surface.

4. The optical coupler according to claim 1, wherein the axis is inclined with respect to the surface of the first terminal plate on which the first conversion element is mounted.

5. A method for producing the optical coupler comprising:
mounting a first conversion element on an upper surface of a first terminal plate;
mounting a second conversion element on an upper surface of a second terminal plate;
supplying a translucent primary mold resin in a fluidized state to the upper surfaces of the first terminal plate and the second terminal plate such that the first conversion element and the second conversion element are covered with the primary mold resin;
curing the primary mold resin while inverting vertically the first terminal plate and the second terminal plate to retain the primary mold resin in a state in which the primary mold resin hangs from the first terminal plate and the second terminal plate; and covering a surface of the primary mold resin with a secondary mold resin having a refractive index lower than that of the primary mold resin.

6. The optical coupler producing method according to claim 5, wherein a portion of the first terminal on which the first conversion element is mounted and a portion of the second terminal on which the second conversion element is mounted are formed into an elliptical shape as a whole.

* * * * *